United States Patent
Hashimoto

(10) Patent No.: US 7,732,884 B2
(45) Date of Patent: Jun. 8, 2010

(54) PHOTOELECTRIC CONVERSION DEVICE AND METHOD OF MANUFACTURING THE SAME

(75) Inventor: Sakae Hashimoto, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/370,958

(22) Filed: Feb. 13, 2009

(65) Prior Publication Data

US 2009/0206434 A1   Aug. 20, 2009

(30) Foreign Application Priority Data

Feb. 18, 2008   (JP) ............................. 2008-036582

(51) Int. Cl.
*H01L 31/04* (2006.01)
*H01L 31/0232* (2006.01)

(52) U.S. Cl. ................ 257/432; 257/435; 257/E31.127

(58) Field of Classification Search ................. 257/231, 257/184, 294, 432, 435; 438/57, 69, 703
See application file for complete search history.

(56) References Cited

U.S. PATENT DOCUMENTS

| | | | |
|---|---|---|---|
| 4,731,665 A | 3/1988 | Hashimoto et al. | 358/213.27 |
| 4,959,723 A | 9/1990 | Hashimoto | 358/213.11 |
| 4,962,412 A | 10/1990 | Shinohara et al. | 357/30 |
| 5,146,339 A | 9/1992 | Shinohara et al. | 358/212 |
| 5,283,428 A | 2/1994 | Morishita et al. | 250/214.1 |
| 7,019,373 B2 | 3/2006 | Hashimoto | 257/432 |
| 7,393,715 B2 | 7/2008 | Tazoe et al. | 438/57 |
| 2003/0063204 A1* | 4/2003 | Suda | 348/272 |
| 2006/0049476 A1* | 3/2006 | Koizumi et al. | 257/432 |
| 2006/0138577 A1 | 6/2006 | Hashimoto | 257/432 |
| 2006/0197097 A1 | 9/2006 | Mori | 257/89 |
| 2007/0001252 A1 | 1/2007 | Noda et al. | 257/432 |
| 2007/0155043 A1 | 7/2007 | Hashimoto | 438/69 |
| 2008/0291304 A1 | 11/2008 | Ota et al. | 348/294 |
| 2009/0021621 A1 | 1/2009 | Hashimoto et al. | 348/300 |

FOREIGN PATENT DOCUMENTS

| | | |
|---|---|---|
| JP | 2001-077339 A | 3/2001 |
| JP | 2005-033074 A | 2/2005 |
| JP | 2006-073882 A | 3/2006 |
| JP | 2006-073886 A | 3/2006 |
| JP | 2006-156611 A | 6/2006 |
| JP | 2006-245101 A | 9/2006 |
| JP | 2007-013061 A | 1/2007 |
| JP | 2007-287818 A | 11/2007 |

* cited by examiner

*Primary Examiner*—Thomas L Dickey
*Assistant Examiner*—Nikolay Yushin
(74) *Attorney, Agent, or Firm*—Fitzpatrick, Cella, Harper & Scinto

(57) ABSTRACT

A photoelectric conversion device comprises a semiconductor substrate and a multilayer wiring structure, wherein the multilayer wiring structure includes a first wiring layer which serves as a top wiring layer in an effective region and contains aluminum as a principal component, a first insulation film arranged in the effective region and an light-shielded region so as to cover the first wiring layer, and a second wiring layer which serves as a top wiring layer arranged on the first insulation film in the light-shielded region and contains aluminum as a principal component, and wherein the first insulation film has, in the effective region, a first portion which is positioned above the photoelectric conversion unit, and the first portion functions as at least a part of an interlayer lens.

12 Claims, 14 Drawing Sheets

F I G. 4
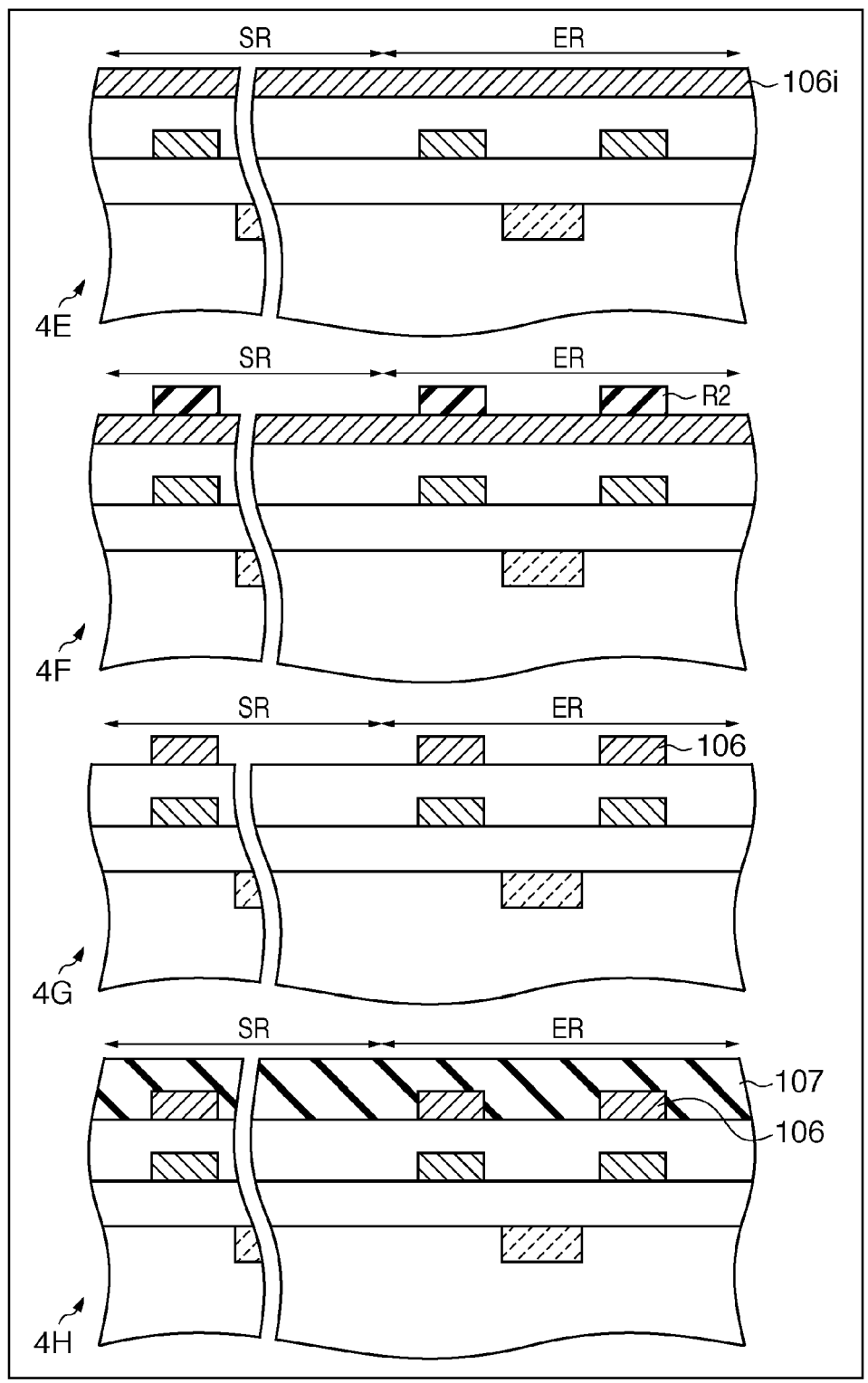

STRUCTURE OF INTERLAYER LENS OF CONVENTIONAL MOS TYPE PHOTOELECTRIC CONVERSION DEVICE

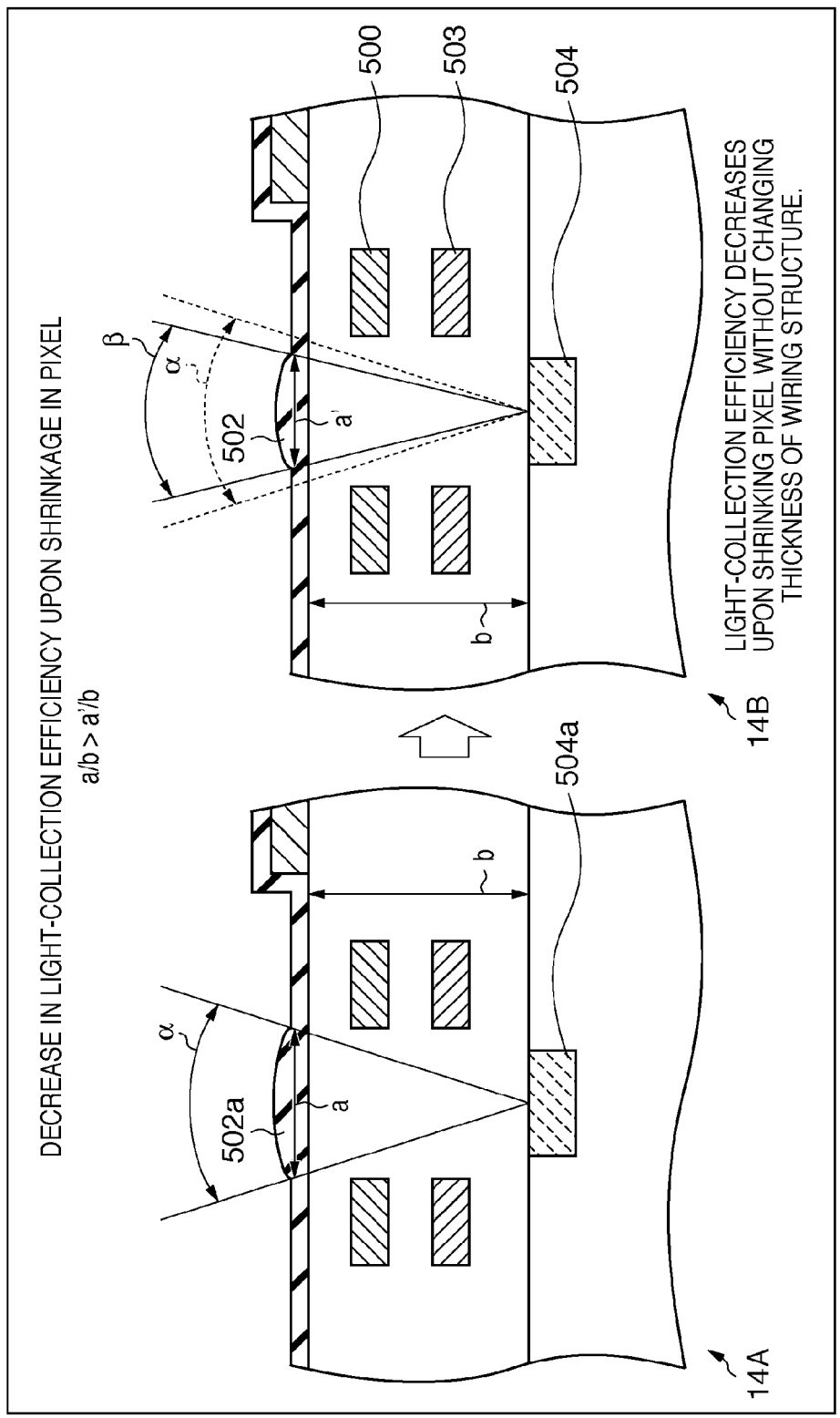

PHOTOELECTRIC CONVERSION DEVICE AND METHOD OF MANUFACTURING THE SAME

BACKGROUND OF THE INVENTION

1. Field of the Invention

The present invention relates to a photoelectric conversion device and a method of manufacturing the same.

2. Description of the Related Art

In recent years, a MOS type photoelectric conversion device using a MOS transistor is under active development. Along with an increase in the number of pixels of such a photoelectric conversion device, the pixel size is shrinking. As the pixel size shrinks, the area of the light-receiving surface of a photoelectric conversion unit (for example, a photodiode) in each pixel also decreases. This may decrease the sensitivity of the photoelectric conversion unit.

To cope with this situation, Japanese Patent Laid-Open No. 2007-13061 discloses a technique of arranging an interlayer lens 502 on a passivation film 505 in the effective region without arranging a planarized film between them, as shown in FIG. 13. This makes it possible to decrease the distance between the interlayer lens and the photoelectric conversion unit as compared with a case in which an interlayer lens is arranged on a planarized film on a passivation film 505 (see FIG. 16 in Japanese Patent Laid-Open No. 2007-13061).

In the technique disclosed in Japanese Patent Laid-Open No. 2007-13061, the distance between the interlayer lens and the photoelectric conversion unit in the effective region is limited by the thickness of a multilayer wiring structure 506.

SUMMARY OF THE INVENTION

It is an aim of the present invention to suppress a decrease in the light-collection efficiency of a photoelectric conversion unit in an effective region while avoiding an increase in the inter-wire coupling capacitance, upon shrinking the pixel size.

According to the first aspect of the present invention, there is provided a photoelectric conversion device having an effective region in which a photoelectric conversion unit is not shielded against light, and a light-shielded region in which a photoelectric conversion unit is shielded against light, the device comprising: a semiconductor substrate in which the photoelectric conversion unit in the effective region and the photoelectric conversion unit in the light-shielded region are arranged; and a multilayer wiring structure arranged on the semiconductor substrate, wherein the multilayer wiring structure includes a first wiring layer which serves as a top wiring layer in the effective region and contains aluminum as a principal component, a first insulation film arranged in the effective region and the light-shielded region so as to cover the first wiring layer, and a second wiring layer which serves as a top wiring layer arranged on the first insulation film in the light-shielded region and contains aluminum as a principal component, and wherein the first insulation film has, in the effective region, a first portion which is positioned above the photoelectric conversion unit, and the first portion functions as at least a part of an interlayer lens.

According to the second aspect of the present invention, there is provided an image sensing system comprising: a photoelectric conversion device according to the first aspect of the present invention; an optical system which forms an image on an image sensing plane of the photoelectric conversion device; and a signal processing unit which processes the signal output from the photoelectric conversion device, and generates image data.

According to the third aspect of the present invention, there is provided a method of manufacturing a photoelectric conversion device having an effective region and a light-shielded region, the method comprising: a first step of forming a photoelectric conversion unit in the effective region and a photoelectric conversion unit in the light-shielded region on a semiconductor substrate; and a second step of forming a multilayer structure on the semiconductor substrate, wherein the second step includes steps of forming a first metal layer, forming a first wiring layer serving as a top wiring layer in the effective region by patterning the first metal layer using photolithography, forming an insulation film in the effective region and the light-shielded region so as to cover the first wiring layer, forming a second metal layer on the insulation film, forming a second wiring layer serving as a top wiring layer in the light-shielded region by patterning the second metal layer using photolithography, and etching a top face of the insulation film in the effective region so that the insulation film has, in the effective region, a first portion which is positioned above the photoelectric conversion unit, and so that the first portion functions as at least a part of an interlayer lens.

According to the present invention, it is possible to suppress a decrease in the light-collection efficiency of a photoelectric conversion unit in an effective region while avoiding an increase in the inter-wire coupling capacitance, upon shrinking the pixel size.

Further features of the present invention will become apparent from the following description of exemplary embodiments with reference to the attached drawings.

BRIEF DESCRIPTION OF THE DRAWINGS

FIG. 4 is a sectional view showing the steps in the method of manufacturing a photoelectric conversion device 100 according to the first embodiment;

FIG. 14 is a view for explaining a problem to be solved by the present invention.

DESCRIPTION OF THE EMBODIMENTS

Figure 1:
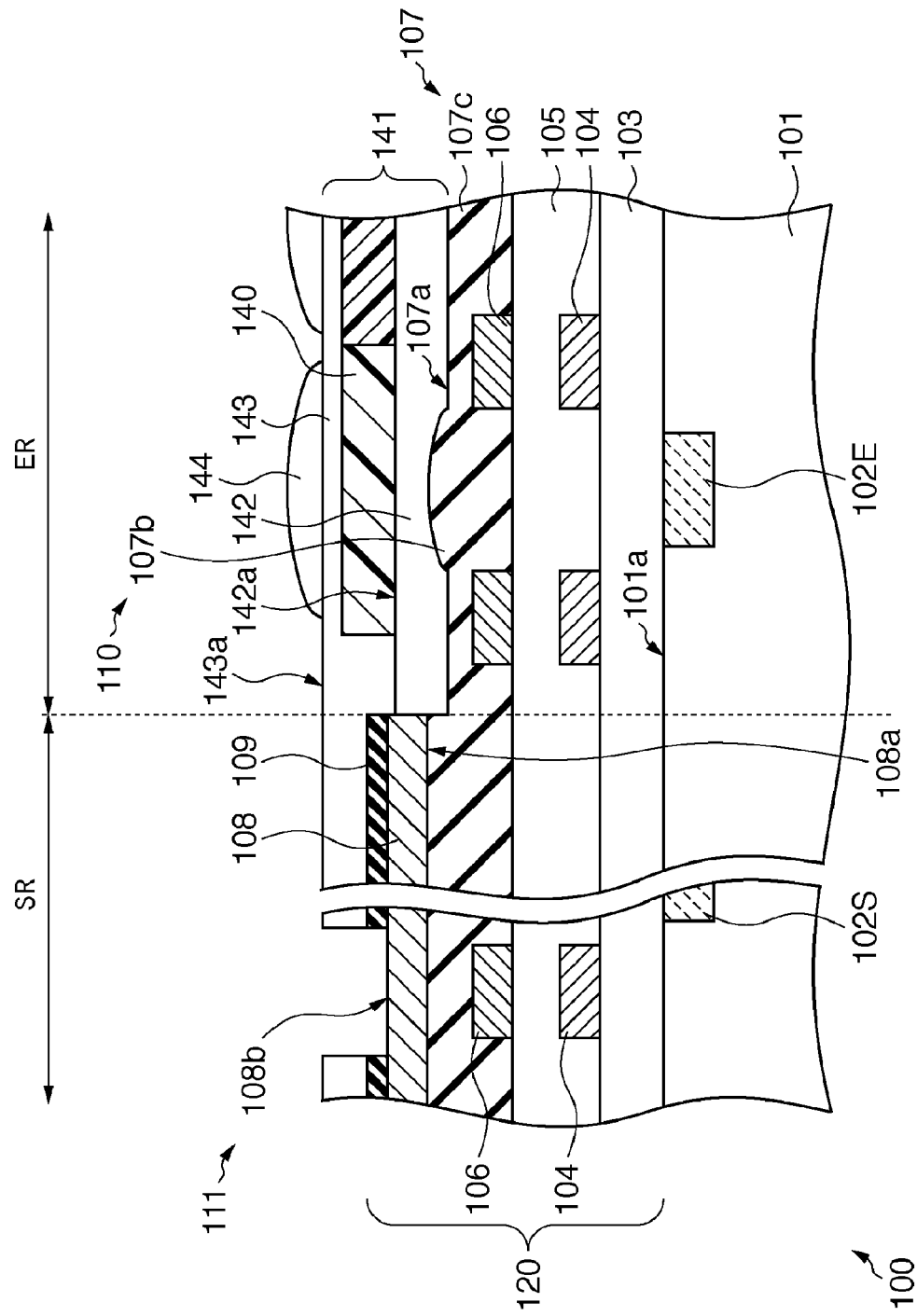
FIG. 1 is a sectional view showing the structure of a photoelectric conversion device 100 according to the first embodiment.

The inventor has performed detailed examination of the technology described in Japanese Patent Laid-Open No. 2007-13061.

A case in which the pixel size is shrunk in a direction along the surface of the semiconductor substrate without changing the thickness of the multilayer wiring structure 506 will be considered herein. Shrinking the diameter of the interlayer lens along with shrinkage in the pixel size makes it hard for the interlayer lens to receive light which enters it at a large incident angle, as shown in FIG. 14. This decreases the light-collection efficiency of the light-collection efficiency of the photoelectric conversion unit (to guide the incident light on a microlens onto a photoelectric conversion unit (for example, a photodiode) via the interlayer lens). This may result in a decrease in the sensitivity of the photoelectric conversion device in the effective region.

For example, a case in which the pixel size (the diameter of the interlayer lens) is shrunk without changing the thickness of the multilayer wiring structure 506, as shown in FIG. 14, will be considered. Let a be the diameter of the interlayer lens before shrinkage in the pixel size. Let a' be the diameter of the interlayer lens after shrinkage in the pixel size. And let b be the distance between the interlayer lens and the photoelectric conversion unit (the thickness of the multilayer wiring structure 506). Then, we have:

$$a/b > a'/b \quad (1)$$

According to this relation, a visual angle β when an interlayer lens 502 is viewed from a photoelectric conversion unit 504 after shrinkage in the pixel size is smaller than a visual angle α when an interlayer lens 502a is viewed from a photoelectric conversion unit 504a before shrinkage in the pixel size. That is, shrinking the pixel size makes it hard for the interlayer lens to receive light which enters it at a wide incident angle.

In contrast, a case in which the pixel size is shrunk in a direction along the surface of the semiconductor substrate while decreasing the thickness of the multilayer wiring structure 506 by shrinking it in a direction perpendicular to the surface of the semiconductor substrate will be considered.

For example, let a be the diameter of the interlayer lens, and b be the distance between the interlayer lens and the photoelectric conversion unit before shrinkage in the pixel size. Let a' be the diameter of the interlayer lens, and b' be the distance between the interlayer lens and the photoelectric conversion unit after shrinkage in the pixel size. Then, we have:

$$a/b = a'/b' \quad (2)$$

According to this relation, the visual angle when an interlayer lens 502 is viewed from a photoelectric conversion unit 504 after shrinkage in the pixel size can be nearly equal to a visual angle α when an interlayer lens 502a is viewed from a photoelectric conversion unit 504a before shrinkage in the pixel size. That is, the interlayer lens can always readily receive light which enters it at a large incident angle, regardless of shrinkage in the pixel size.

However, shrinking the multilayer wiring structure 506 in a direction perpendicular to the surface of the semiconductor substrate decreases the distance between wiring layers 500 and 503 adjacent along that direction, so the coupling capacitance (inter-wire coupling capacitance) between the wiring layers 500 and 503 increases. This decreases the signal transfer speeds of the wiring layers 500 and 503.

Preferable embodiments of the present invention will be described in detail with reference to the accompanying drawings.

A photoelectric conversion device 100 according to the first embodiment of the present invention will be explained with reference to FIG. 1. FIG. 1 is a sectional view showing the structure of the photoelectric conversion device 100 according to the first embodiment of the present invention. For the sake of simplicity, a description of the detailed configuration of, for example, each semiconductor region formed on a semiconductor substrate will not be given in an explanation and drawings of this embodiment.

The photoelectric conversion device 100 includes a semiconductor substrate 101, multilayer wiring structure 120, color filter layer 141, and microlens 144. The photoelectric conversion device 100 has an effective region ER and light-shielded region SR. The effective region ER means a region in which a photoelectric conversion unit is not shielded against light. The light-shielded region SR means a region in which a photoelectric conversion unit is shielded against light, and a region including, for example, a driving circuit.

A photoelectric conversion unit 102E in the effective region ER and a photoelectric conversion unit 102S in the light-shielded region SR are arranged on the semiconductor substrate 101. An example of the photoelectric conversion units 102E and 102S is a photodiode.

The multilayer wiring structure 120 is arranged on the semiconductor substrate 101. The multilayer wiring structure 120 includes an interlayer insulation film 103, an interlayer insulation film (second insulation film) 105, an interlayer insulation film (first insulation film) 107, a wiring layer (third wiring layer) 104, a wiring layer (first wiring layer) 106, a wiring layer (second wiring layer) 108, and a passivation film 109.

The interlayer insulation film 103 is arranged on the semiconductor substrate 101. The interlayer insulation film 103 is made of, for example, silicon oxide.

The wiring layer 104 is arranged on the interlayer insulation film 103 and beneath the wiring layer 106. The wiring layer 104 contains aluminum as a principal component and is made of, for example, an Al—Si-based intermetallic compound, an Al—Cu-based intermetallic compound, or an Al—Si—Cu-based intermetallic compound.

The interlayer insulation film 105 is arranged in the effective region ER and light-shielded region SR so as to cover the wiring layer 104. The interlayer insulation film 105 is made of, for example, silicon oxide.

The wiring layer 106 is arranged on the interlayer insulation film 105. The wiring layer 106 serves as the top wiring layer in the effective region ER. The wiring layer 106 contains aluminum as a principal component and is made of, for example, an Al—Si-based intermetallic compound, an Al—Cu-based intermetallic compound, or an Al—Si—Cu-based intermetallic compound.

The interlayer insulation film 107 is arranged in the effective region ER and light-shielded region SR so as to cover the wiring layer 106. The interlayer insulation film 107 is made of, for example, silicon nitride.

Note that a portion 107b, which is positioned above the photoelectric conversion unit 102E in the effective region ER, of the interlayer insulation film 107 has a convex shape along a direction away from a surface 101a of the semiconductor substrate 101. This allows the portion (first portion) 107b, which is positioned above the photoelectric conversion unit 102E in the effective region ER, of the interlayer insulation film 107 to comprise an interlayer lens 110. Also, a top face 107a of the interlayer insulation film 107 in the effective region ER is closer to the surface 101a of the semiconductor substrate 101 than a bottom face 108a of the wiring layer 108 in the light-shielded region SR. In other words, the top face 107a of the portion 107b and another portion (second portion) 107c of the interlayer insulation film 107 in the effective region ER is closer to the surface 101a of the semiconductor substrate 101 than a top face 108a of the interlayer insulation film 107 in the light-shielded region SR. This decreases the distance between the interlayer lens 110 and the photoelectric conversion unit 102E as compared with the technique disclosed in Japanese Patent Laid-Open No. 2007-13061.

The wiring layer 108 is arranged on the interlayer insulation film 107. The wiring layer 108 serves as the top wiring layer in the light-shielded region SR. The wiring layer 108 contains aluminum as a principal component and is made of, for example, an Al—Si-based intermetallic compound, an Al—Cu-based intermetallic compound, or an Al—Si—Cu-based intermetallic compound. The wiring layer 108 shields the photoelectric conversion unit 102S in the light-shielded region SR against light. A part 108b of the top face of the wiring layer 108 is exposed and functions as an electrode pad 111.

The passivation film 109 is arranged in the light-shielded region SR so as to cover the wiring layer 108. The passivation film 109 is not arranged in the effective region ER. In the effective region ER, the interlayer insulation film 107 plays a role of protecting the wiring layer 106. The passivation film 109 is made of, for example, silicon nitride. The passivation film 109 has an opening portion formed on the electrode pad 111.

The color filter layer 141 is arranged on the multilayer wiring structure 120. The color filter layer 141 includes a lower planarized layer 142, a colored layer (color filters) 140, and an upper planarized layer 143.

The lower planarized layer 142 is arranged on the interlayer insulation film 107 in the effective region ER. The lower planarized layer 142 is a layer whose face 142a on which the colored layer 140 is arranged is planarized. The lower planarized layer 142 is made of, for example, an acrylic resin or epoxy resin.

The colored layer 140 is arranged on the lower planarized layer 142 above the interlayer lens 110. The colored layer 140 contains a pigment and dye and is formed to have a peak of spectral transmittance at a predetermined wavelength.

The upper planarized layer 143 is arranged in the light-shielded region SR and effective region ER so as to cover the passivation film 109, lower planarized layer 142, and colored layer 140. The upper planarized layer 143 is a layer whose face 143a on which the microlens 144 is arranged is planarized. The upper planarized layer 143 has an opening portion formed on the electrode pad 111.

The microlens 144 is arranged above the photoelectric conversion unit 102E, interlayer lens 110, and colored layer 140.

As described above, according to this embodiment, a photoelectric conversion device is configured such that the portion 107b, which is positioned above the photoelectric conversion unit 102E, of the interlayer insulation film 107 arranged on the wiring layer 106 in the effective region ER functions as the interlayer lens 110. This makes it possible to shrink the pixel size so as to satisfy relation (2) without decreasing the distance between wiring layers in a direction perpendicular to the surface 101a of the semiconductor substrate 101, upon shrinking the diameter of the interlayer lens 101 from a to a' (see FIG. 14).

Figure 2:
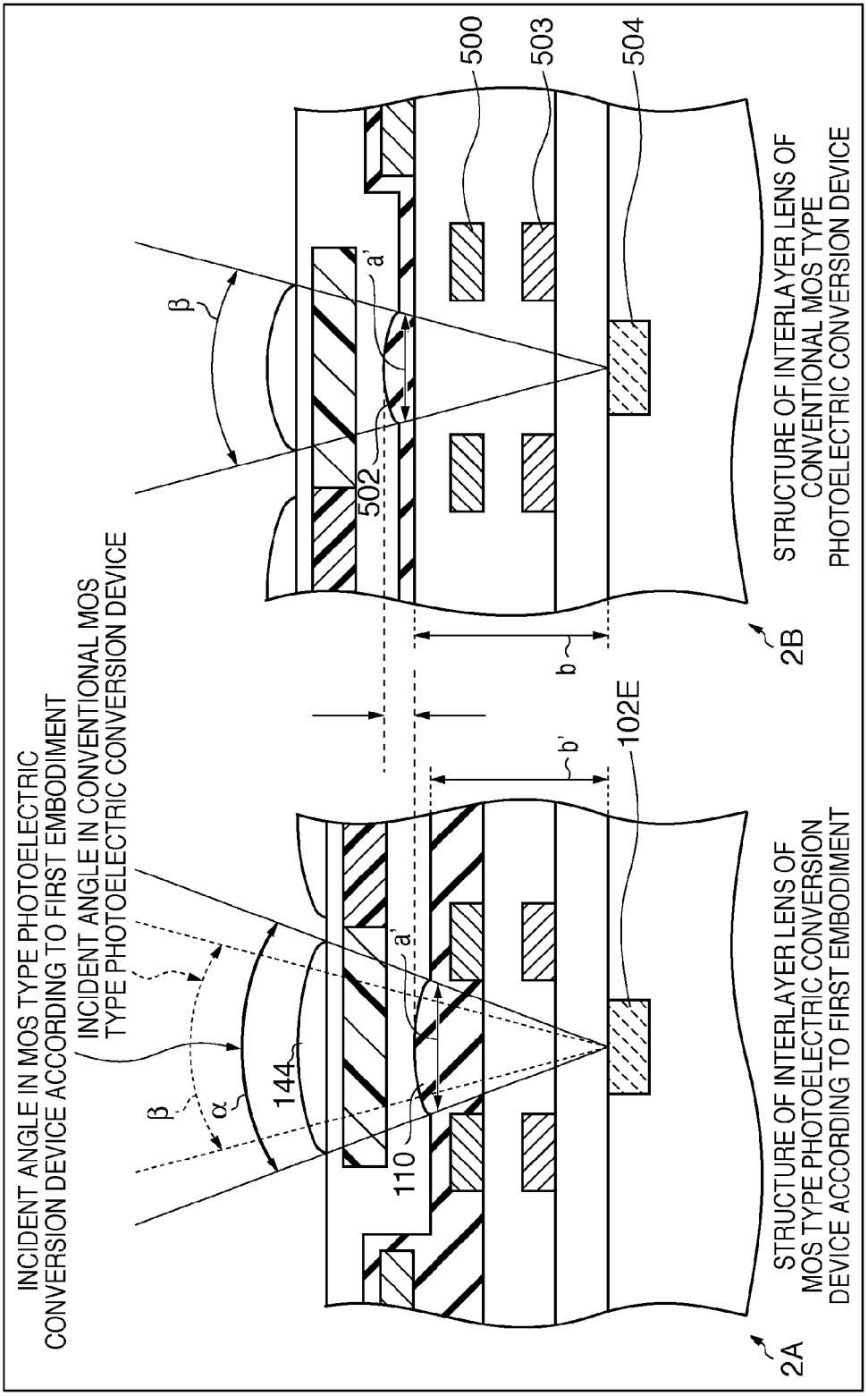
FIG. 2 is a view showing the features of the photoelectric conversion device 100 in the first embodiment.

For example, it is possible to shrink the pixel size so as to satisfy relation (2) without changing the distance between wiring layers 500 and 503 in a direction perpendicular to the surface 101a of the semiconductor substrate 101, as shown in FIG. 2. That is, let $\alpha$ be the visual angle when the interlayer lens 110 is viewed from the photoelectric conversion unit 102E in this embodiment (see 2A of FIG. 2). Let $\beta$ be the visual angle when an interlayer lens 502 is viewed from a photoelectric conversion unit 504 upon shrinking the pixel size in the conventional configuration so as to satisfy relation (1) (see 2B of FIG. 2). Then, the angle $\alpha$ is wider than the angle $\beta$. Because the interlayer lens 110 can be arranged at a lower position relative to the photoelectric conversion unit 102E, that is, a position closer to the photoelectric conversion unit 102E than in the conventional configuration, the photoelectric conversion unit 102E can receive light which enters it at a wider angle than in the conventional configuration. This makes it possible to suppress a decrease in the light-collection efficiency to guide the incident light on the microlens 144 onto the photoelectric conversion unit 102E. That is, it is possible to suppress a decrease in the light-collection efficiency of the photoelectric conversion unit 102E in the effective region ER. It is therefore possible to suppress a decrease in the sensitivity of the photoelectric conversion unit 102E.

Figure 3:
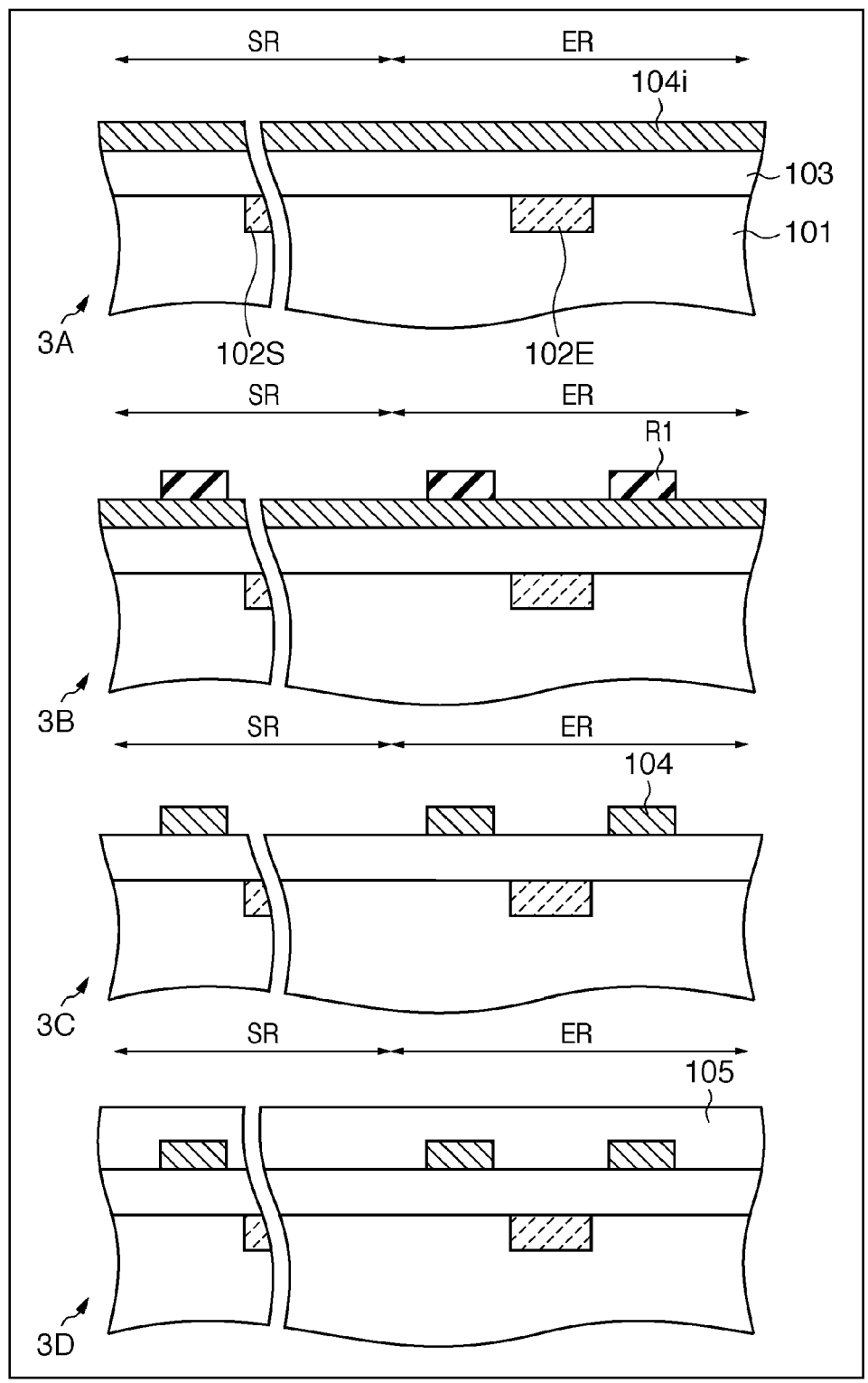
FIG. 3 is a sectional view showing the steps in a method of manufacturing a photoelectric conversion device 100 according to the first embodiment.

A method of manufacturing a photoelectric conversion device 100 according to the first embodiment of the present invention will be explained with reference to FIGS. 3 to 8. FIGS. 3 to 7 are sectional views showing the steps in the method of manufacturing a photoelectric conversion device 100 according to the first embodiment of the present invention. FIGS. 3 and 4 are sectional views for explaining patterning of wiring layers in detail, and FIG. 7 is a sectional view for explaining a step of forming a lens shape in detail.

In the step shown in 3A of FIG. 3 (first step), a photoelectric conversion unit 102E in an effective region ER and a photoelectric conversion unit 102S in a light-shielded region SR are formed in a semiconductor substrate 101. An element isolation portion (not shown) and other semiconductor regions (not shown) are also formed in the semiconductor substrate 101.

Polysilicon serving as the gate electrode of a transistor (not shown) is formed on a semiconductor substrate 101.

Subsequently (second step), a multilayer wiring structure 120 is formed on the semiconductor substrate 101. More specifically, the following steps are performed.

A silicon oxide film is deposited on the semiconductor substrate 101 by CVD (Chemical Vapor Deposition). The top face of the deposited silicon oxide film is planarized by CMP (Chemical Mechanical Polishing), thereby forming an interlayer insulation film 103.

A metal layer 104i which contains aluminum as a principal component is formed on the interlayer insulation film 103. The metal layer 104i is made of, for example, an Al—Si-based intermetallic compound, an Al—Cu-based intermetallic compound, or an Al—Si—Cu-based intermetallic compound.

In the step shown in 3B of FIG. 3, a pattern of a resist R1 corresponding to that of a wiring layer 104 is formed on the metal layer 104i.

In the step shown in 3C of FIG. 3, the metal layer 104i is etched using the pattern of the resist R1 as a mask, thereby forming a wiring layer 104. That is, the metal layer 104i is patterned using photolithography, thereby forming a wiring layer 104. Note that after the wiring layer 104 is formed, the resist R1 is removed.

In the step shown in 3D of FIG. 3, a silicon oxide film is deposited by CVD so as to cover the wiring layer 104. The top face of the deposited silicon oxide film is planarized by CMP, thereby forming an interlayer insulation film 105 in the effective region ER and light-shielded region SR.

If HDP (High-Density Plasma) CVD is selectively used in forming an interlayer insulation film 105 as needed in accordance with the pattern density of the wiring layer 104, the filling property improves. This makes it possible to prevent the generation of any voids between wiring lines.

In the step shown in 4E of FIG. 4, a metal layer (first metal layer) 106$i$ which contains aluminum as a principal component is formed on the interlayer insulation film 105. The metal layer 106$i$ is made of, for example, an Al—Si-based intermetallic compound, an Al—Cu-based intermetallic compound, or an Al—Si—Cu-based intermetallic compound.

In the step shown in 4F of FIG. 4, a pattern of a resist R2 corresponding to that of a wiring layer 106 is formed on the metal layer 106$i$.

In the step shown in 4G of FIG. 4, the metal layer 106$i$ is etched using the pattern of the resist R2 as a mask, thereby forming a wiring layer 106. That is, the metal layer 106$i$ is patterned using photolithography, thereby forming a wiring layer 106 serving as the top wiring layer in the effective region ER. Note that after the wiring layer 106 is formed, the resist R2 is removed.

In the step shown in 4H of FIG. 4, a silicon nitride film is deposited by CVD so as to cover the wiring layer 106. The top face of the deposited silicon nitride film is planarized by CMP, thereby forming an interlayer insulation film 107 in the effective region ER and light-shielded region SR.

If HDP (High-Density Plasma) CVD is selectively used in forming an interlayer insulation film 107 as needed in accordance with the pattern density of the wiring layer 106, the filling property improves. This makes it possible to prevent the generation of any voids between wiring lines.

Figure 5:
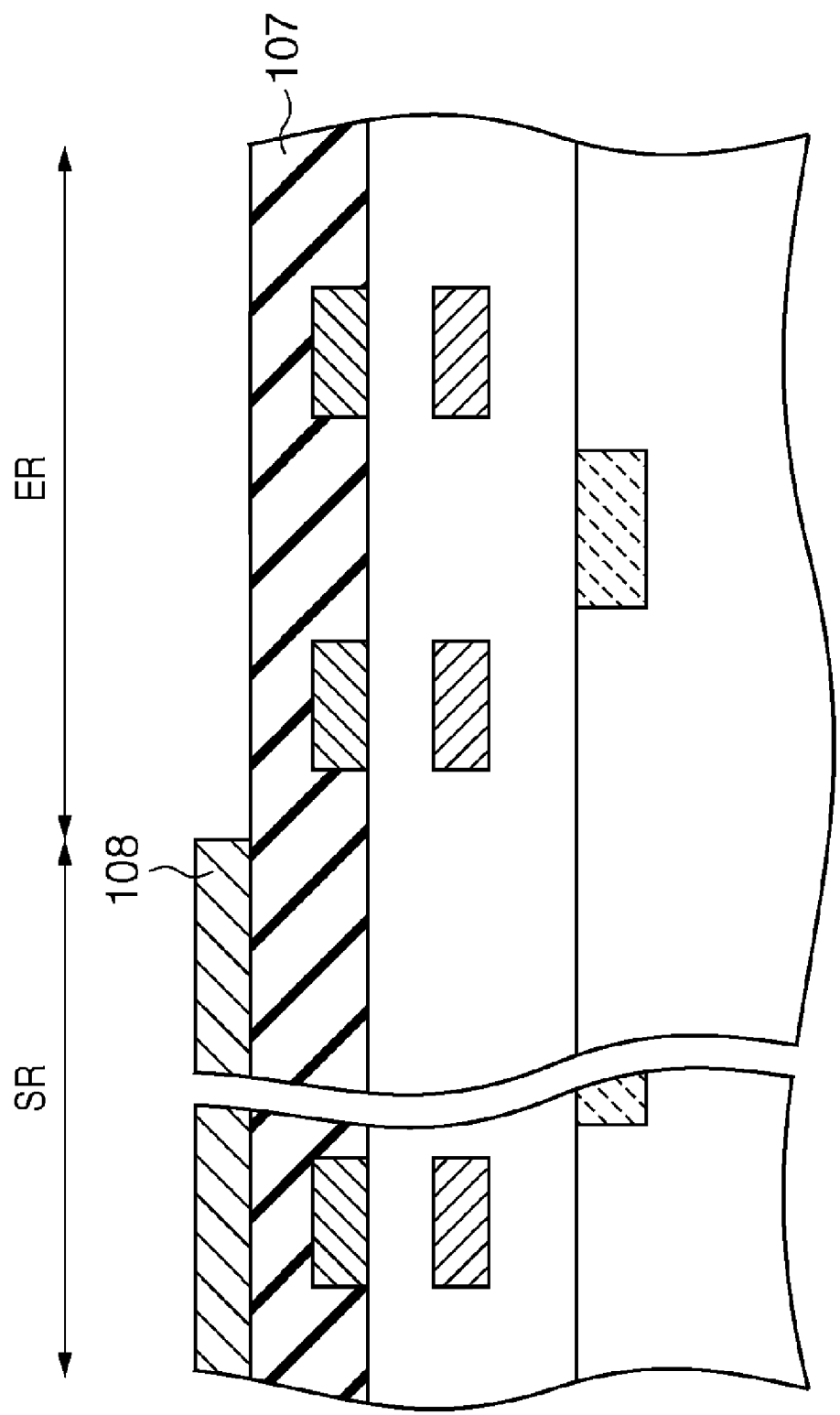
FIG. 5 is a sectional view showing the steps in the method of manufacturing a photoelectric conversion device 100 according to the first embodiment.

In the step shown in FIG. 5, a metal layer (a second metal layer; not shown) which contains aluminum as a principal component is formed on the interlayer insulation film 107. The metal layer is made of, for example, an Al—Si-based intermetallic compound, an Al—Cu-based intermetallic compound, or an Al—Si—Cu-based intermetallic compound.

A pattern of a resist (not shown) corresponding to that of a wiring layer 108 is formed on the metal layer.

The metal layer is etched by dry etching using the pattern of the resist as a mask, thereby forming a wiring layer 108. That is, the metal layer is patterned using photolithography, thereby forming a wiring layer 108 serving as the top wiring layer in the light-shielded region SR. Note that after the wiring layer 108 is formed, the resist is removed.

Figure 6:
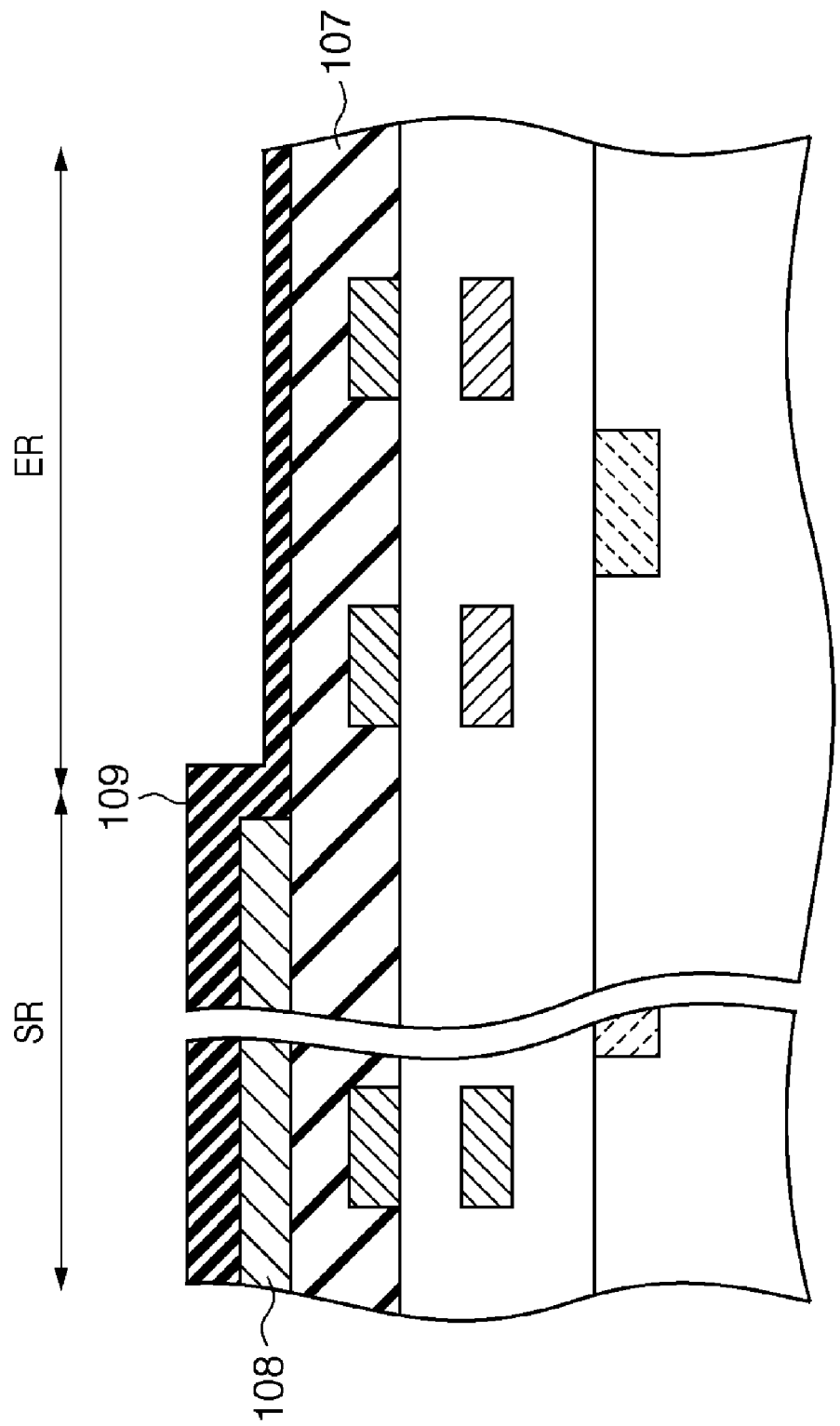
FIG. 6 is a sectional view showing the steps in the method of manufacturing a photoelectric conversion device 100 according to the first embodiment.
Figure 7:
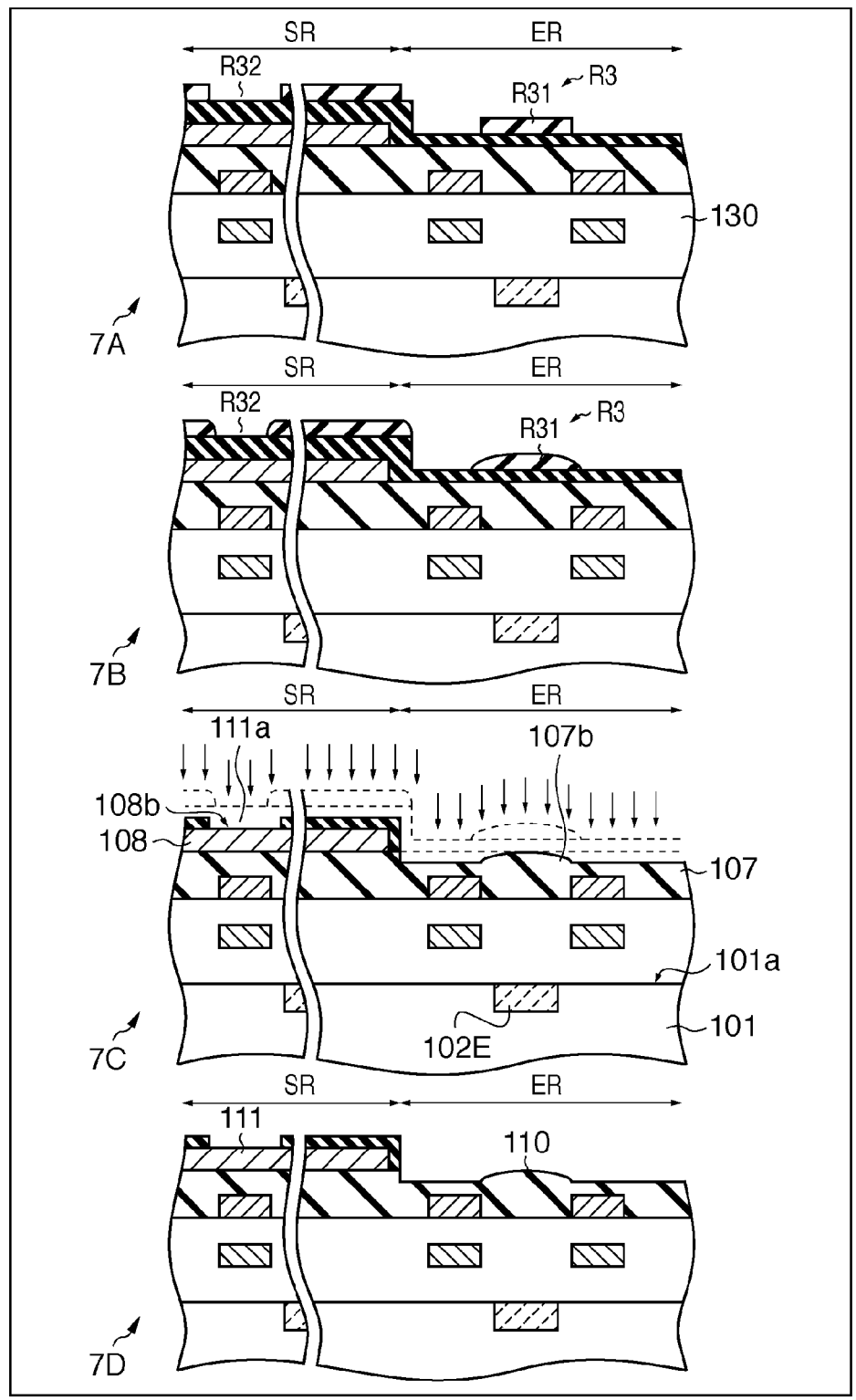
FIG. 7 is a sectional view showing the steps in the method of manufacturing a photoelectric conversion device 100 according to the first embodiment.

In the step shown in FIG. 6, a passivation film 109 is formed in the effective region ER and light-shielded region SR so as to cover the wiring layer 108 and interlayer insulation film 107. The passivation film 109 is formed of a silicon nitride film.

In the step shown in 7A of FIG. 7, a pattern of a resist R3 corresponding to an electrode pad 111 and interlayer lens 110 is formed on the passivation film 109. That is, a pattern of a resist R3 having an opening R32 in the light-shielded region SR and an isolated pattern R31, which has e.g. circular shape, in the effective region ER is formed on the passivation film 109. At this time, forming an opening pattern R32 and an isolated pattern R31 using the same mask makes it possible to attain facilitation of the steps.

In the step shown in 7B of FIG. 7, reflowing by heating the resist R3 up to proximity its melting point is performed, thereby changing the top face of the isolated pattern R31 into a curved surface corresponding to a convex lens shape. Note that if a pattern such as a pad opening pattern, which has an area sufficiently larger than the pixel size, exists, it deforms to have a blunt edge.

In the step shown in 7C of FIG. 7 (etching step), the passivation film 109 and interlayer insulation film 107 are thoroughly etched by dry etching until the resist R3 and the passivation film 109 in the effective region ER are removed totally. With this operation, the patterns R32 and R31 of the resist R3 are transferred onto the passivation film 109 and interlayer insulation film 107. The passivation film 109 may partially stay unetched on the side face of the wiring layer 108.

The top face of the interlayer insulation film 107 in the effective region ER is etched so that a portion 107$b$ positioned above the photoelectric conversion unit 102E in the effective region ER has a convex shape along a direction away from the surface 101$a$ of the semiconductor substrate 101. That is, the top face of the interlayer insulation film 107 in the effective region ER is etched so that the portion 107$b$, which is positioned above the photoelectric conversion unit 102E in the effective region ER, of the interlayer insulation film 107 functions as the interlayer lens 110. In addition, the top face of the interlayer insulation film 107 in the effective region ER is etched so that the top face in the effective region ER becomes closer to a surface 101$a$ of the semiconductor substrate 101 than that in the light-shielded region SR.

At the same time, the passivation film 109 in the light-shielded region SR is partially etched so as to form an opening 111$a$ to expose a part 108$b$ of the wiring layer 108.

With the above-mentioned process, an electrode pad 111 and an interlayer lens 110 are formed in the same steps (see 7D in FIG. 7).

Figure 8:
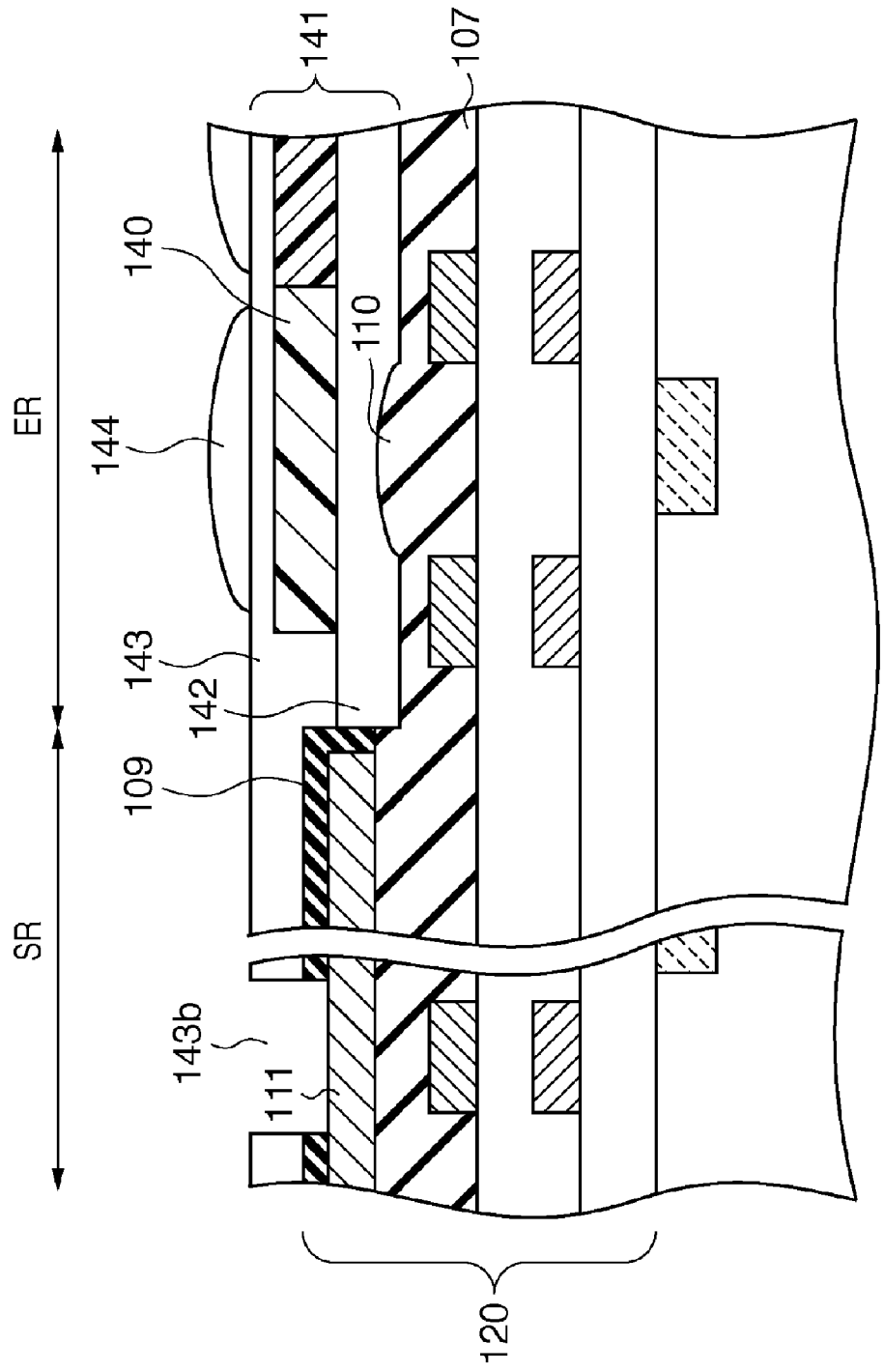
FIG. 8 is a sectional view showing the steps in the method of manufacturing a photoelectric conversion device 100 according to the first embodiment.

In the step shown in FIG. 8, a color filter layer 141 is formed on a multilayer wiring structure 120. More specifically, the following steps are performed.

A lower planarized layer 142 is formed on the interlayer insulation film 107 in the effective region ER. The lower planarized layer 142 is made of, for example, an acrylic resin or epoxy resin. A lower planarized layer 142 can be formed as needed in order to reduce any steps on the multilayer wiring structure 120 and those generated upon forming an interlayer lens 110 to be able to uniformly form a colored layer 140.

A colored layer 140 is formed on the lower planarized layer 142 in the effective region ER above the interlayer lens 110. The colored layer 140 is formed to contain a pigment and dye.

An upper planarized layer 143 is formed in the light-shielded region SR and effective region ER so as to cover the passivation film 109, lower planarized layer 142, and colored layer 140. An upper planarized layer 143 can be formed as needed in order to reduce any steps generated upon forming a colored layer 140 to be able to uniformly form a microlens 144. An opening 143$b$ is formed in a portion, which corresponds to the electrode pad 111, of the upper planarized layer 143.

A microlens 144 is formed on the color filter layer 141. The microlens 144 is formed of, for example, a resist.

As described above, according to this embodiment, a photoelectric conversion device is configured such that the portion 107$b$, which is positioned above the photoelectric conversion unit 102E, of the interlayer insulation film 107 arranged on the wiring layer 106 in the effective region ER functions as the interlayer lens 110. This allows the photoelectric conversion unit 102E to receive light which enters it at a wide angle without decreasing the distance between wiring layers in a direction perpendicular to the surface 101a of the semiconductor substrate 101. This makes it possible to suppress a decrease in the light-collection efficiency to guide the incident light on the microlens 144 onto the photoelectric conversion unit 102E. That is, it is possible to suppress a decrease in the light-collection efficiency of a photoelectric conversion unit in an effective region while avoiding an increase in the inter-wire coupling capacitance, upon shrinking the pixel size.

It should be noted that, although the numbers of wiring layers in the effective region ER and light-shielded region SR are two and three, respectively, in this embodiment, the present invention is not particularly limited to this. This embodiment provides a configuration effective in all photoelectric conversion devices in each of which the number of wiring layers in the effective region ER is smaller than that in the light-shielded region SR by one.

In the step shown in 7C of FIG. 7, the passivation film 109 may be etched so that the passivation film 109 in the effective region ER partially stays unetched. That is, the passivation film 109 and the top face of the interlayer insulation film 107 in the effective region ER are etched using photolithography so that portions, which are positioned above the photoelectric conversion unit 102E in the effective region ER, of the passivation film 109 and interlayer insulation film 107 function as the interlayer lens 110. With this process, the passivation film 109 is arranged in the effective region ER so as to cover the portion 107b, which is positioned above the photoelectric conversion unit 102E in the effective region ER, of the interlayer insulation film 107, and is arranged in the light-shielded region SR so as to cover the wiring layer 108. In this case, a portion (first portion) 107b, which is positioned above the photoelectric conversion unit 102E in the effective region ER, of the interlayer insulation film 107 functions as a part of an interlayer lens 110. A portion (third portion), which is positioned above the photoelectric conversion unit 102E in the effective region ER, of the passivation film 109 has a convex shape along a direction away from the surface 101a of the semiconductor substrate 101, and functions as another part of the interlayer lens 110. Even in this case, the top face 107a of another portion (second portion) 107c of the interlayer insulation film 107 in the effective region ER is closer to the surface 101a of the semiconductor substrate 101 than a top face 108a of the interlayer insulation film 107 in the light-shielded region SR.

In the step shown in FIG. 8, the lower planarized layer 142 may cover the light-shielded region SR. Even with this configuration, the effect of this embodiment can be obtained.

Figure 9:
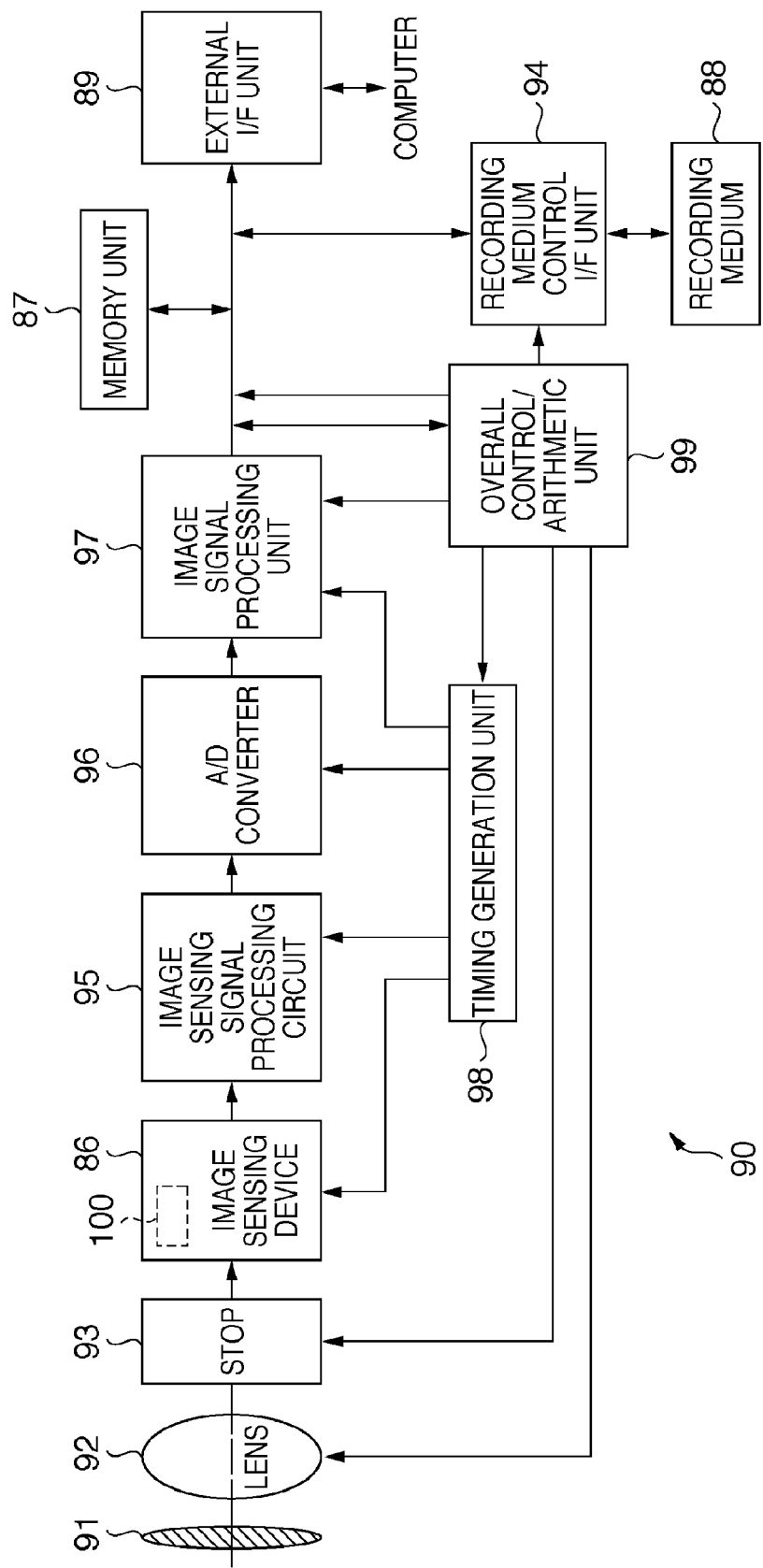
FIG. 9 is a block diagram showing the configuration of an image sensing system to which the photoelectric conversion device according to the first embodiment is applied.

FIG. 9 shows an example of an image sensing system to which the photoelectric conversion device according to the present invention is applied.

An image sensing system 90 mainly includes an optical system, image sensing device 86, and signal processing unit, as shown in FIG. 9. The optical system mainly includes a shutter 91, lens 92, and stop 93. The image sensing device 86 includes a photoelectric conversion device 100. The signal processing unit mainly includes an image sensing signal processing circuit 95, A/D converter 96, image signal processing unit 97, memory unit 87, external I/F unit 89, timing generation unit 98, overall control/arithmetic unit 99, recording medium 88, and recording medium control I/F unit 94. The signal processing unit need not always include a recording medium 88.

The shutter 91 is arranged in the optical path immediately before the lens 92, and controls exposure.

The lens 92 refracts the incident light, thereby forming an object image on the image sensing plane of the photoelectric conversion device 100 in the image sensing device 86.

The stop 93 is arranged in the optical path between the lens 92 and the photoelectric conversion device 100, and adjusts the amount of light guided to the photoelectric conversion device 100 upon propagating through the lens 92.

The photoelectric conversion device 100 in the image sensing device 86 converts the object image formed on the image sensing plane of the photoelectric conversion device 100 into an image signal. The image sensing device 86 reads out the image signal from the photoelectric conversion device 100, and outputs it.

The image sensing signal processing circuit 95 is connected to the image sensing device 86 and processes the image signal output from the image sensing device 86.

The A/D converter 96 is connected to the image sensing signal processing circuit 95 and converts the processed the image signal (analog signal) output from the image sensing signal processing circuit 95 into an image signal (digital signal).

The image signal processing unit 97 is connected to the A/D converter 96. The image signal processing unit 97 performs arithmetic processing such as various kinds of correction for the image signal (digital signal) output from the A/D converter 96, and generates image data. The resultant image data is supplied to, for example, the memory unit 87, external I/F unit 89, overall control/arithmetic unit 99, and recording medium control I/F unit 94.

The memory unit 87 is connected to the image signal processing unit 97 and stores the image data output from the image signal processing unit 97.

The external I/F unit 89 is connected to the image signal processing unit 97. The image data output from the image signal processing unit 97 is transferred to an external device (for example, a personal computer) via the external I/F unit 89.

The timing generation unit 98 is connected to the image sensing device 86, image sensing signal processing circuit 95, A/D converter 96, and image signal processing unit 97. Timing signals are supplied to the image sensing device 86, image sensing signal processing circuit 95, A/D converter 96, and image signal processing unit 97. The image sensing device 86, image sensing signal processing circuit 95, A/D converter 96, and image signal processing unit 97 operate in synchronism with the timing signals.

The overall control/arithmetic unit 99 is connected to the timing generation unit 98, image signal processing unit 97, and recording medium control I/F unit 94, and controls their overall operation.

The recording medium 88 is detachably connected to the recording medium control I/F unit 94. The image data output from the image signal processing unit 97 is recorded on the recording medium 88 via the recording medium control I/F unit 94.

With the above-mentioned configuration, a satisfactory image (image data) can be obtained as long as a satisfactory image signal can be obtained by the photoelectric conversion device 100.

Figure 10:
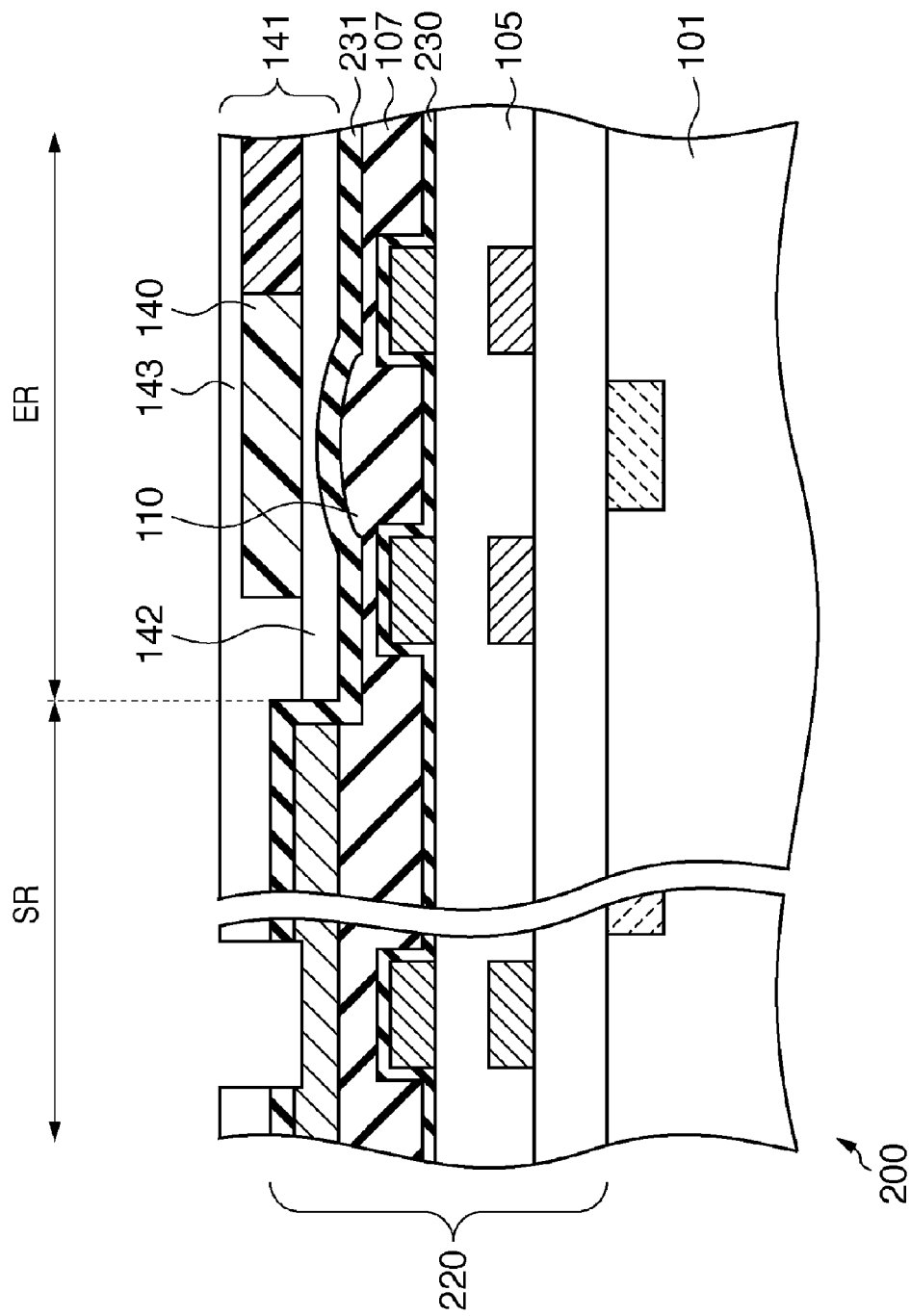
FIG. 10 is a sectional view showing the structure of a photoelectric conversion device 200 according to the second embodiment.

A photoelectric conversion device 200 according to the second embodiment will be explained next with reference to FIG. 10. FIG. 10 is a sectional view showing the structure of the photoelectric conversion device according to the second embodiment of the present invention. Points different from those in the first embodiment will be mainly described below.

The photoelectric conversion device 200 includes a multilayer wiring structure 220. The multilayer wiring structure 220 includes an antireflection film (first antireflection film) 231 and an antireflection film (second antireflection film) 230.

The antireflection film 231 is arranged so as to prevent light reflection at the interface between a lower planarized layer 142 and an interlayer lens 110 (interlayer insulation film 107). The lower planarized layer 142 is made of, for example, an acrylic resin or epoxy resin. The interlayer lens 110 (interlayer insulation film 107) is made of, for example, silicon nitride. The antireflection film 231 is made of a substance such as silicon oxynitride, which has a refractive index between those of the lower planarized layer 142 and interlayer lens 110. Letting λ be the wavelength of light transmitted through a colored layer 140, and n2 and n3 be the refractive indices of the interlayer insulation film 107 and lower planarized layer 142, respectively, the antireflection film 231 is formed to have a thickness of $\lambda/4\sqrt{(n2 \times n3)}$ and a refractive index of $\sqrt{(n2 \times n3)}$. In this case, the antireflection film 231 can effectively prevent light reflection at the interface between the lower planarized layer 142 and the interlayer lens 110 (interlayer insulation film 107). Note that λ is defined by the design of a photoelectric conversion unit and a color filter, and takes a value which falls within the range of 450 to 650 nm.

The antireflection film 230 is arranged so as to prevent light reflection at the interface between the interlayer insulation film 107 and an interlayer insulation film 105. The interlayer insulation film 107 is made of, for example, silicon nitride. The interlayer insulation film 105 is made of, for example, silicon oxide. The antireflection film 230 is made of a substance such as silicon oxynitride, which has a refractive index between those of the interlayer insulation film 107 and interlayer insulation film 105. Letting λ be the wavelength of light transmitted through the colored layer 140, and n2 and n1 be the refractive indices of the interlayer insulation film 107 and interlayer insulation film 105, respectively, the antireflection film 230 is formed to have a thickness of $\lambda/4\sqrt{(n1 \times n2)}$ and a refractive index of $\sqrt{(n1 \times n2)}$. In this case, the antireflection film 230 can effectively prevent light reflection at the interface between the interlayer insulation films 107 and 105. Note that λ takes a value which falls within the range of 450 to 650 nm.

Figure 11:
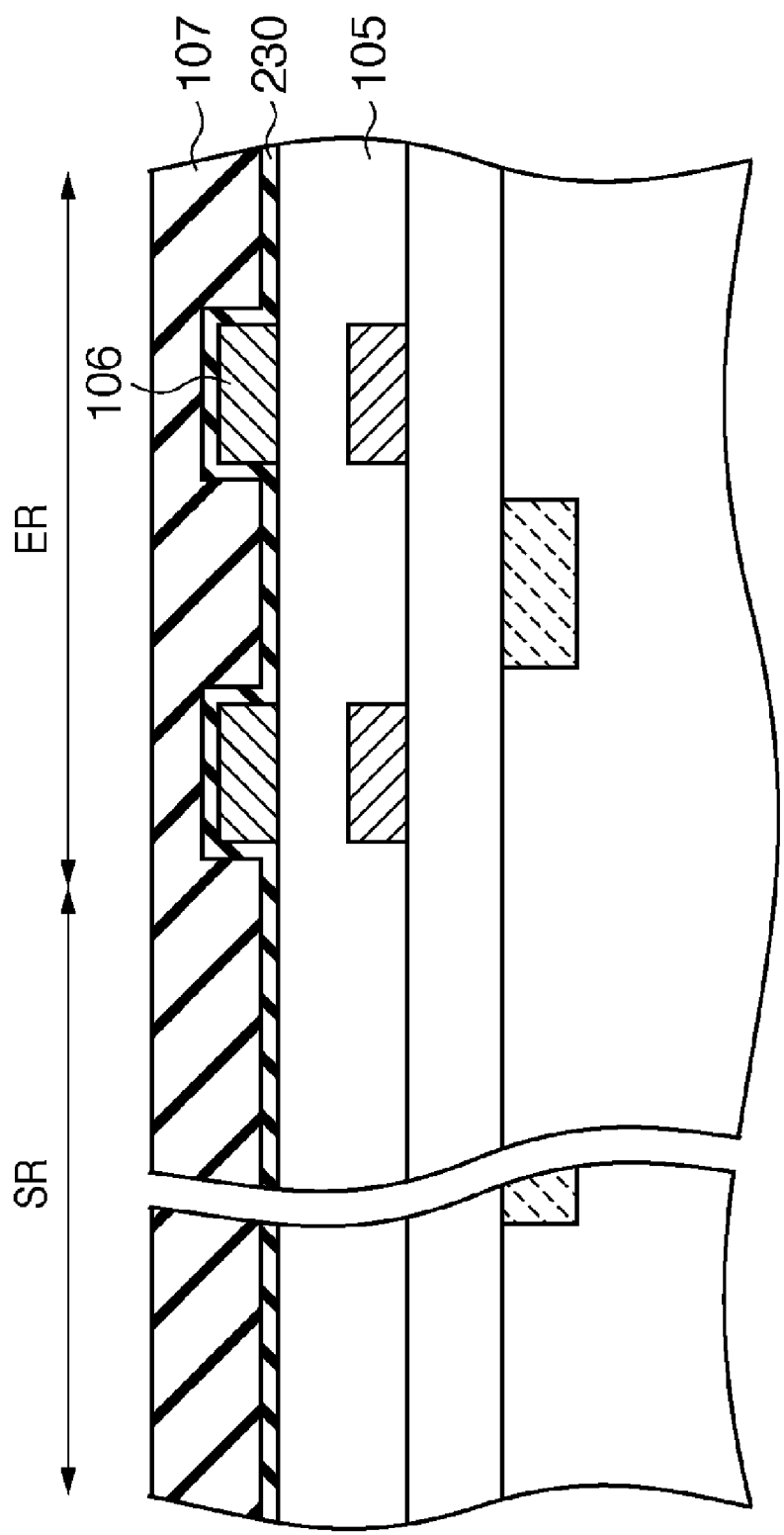
FIG. 11 is a sectional view showing the steps in a method of manufacturing a photoelectric conversion device 200 according to the second embodiment.
Figure 12:
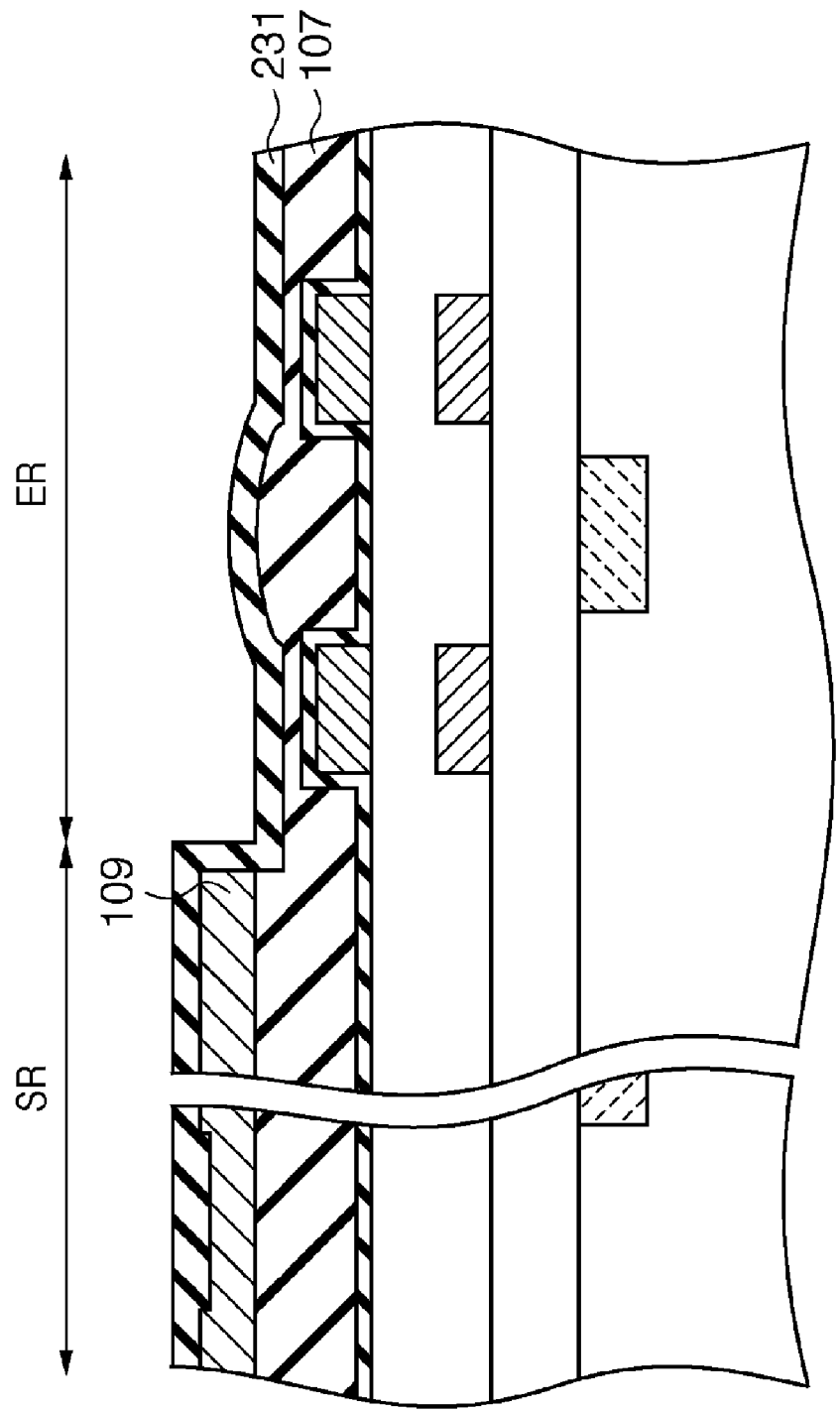
FIG. 12 is a sectional view showing the steps in the method of manufacturing a photoelectric conversion device 200 according to the second embodiment.
Figure 13:
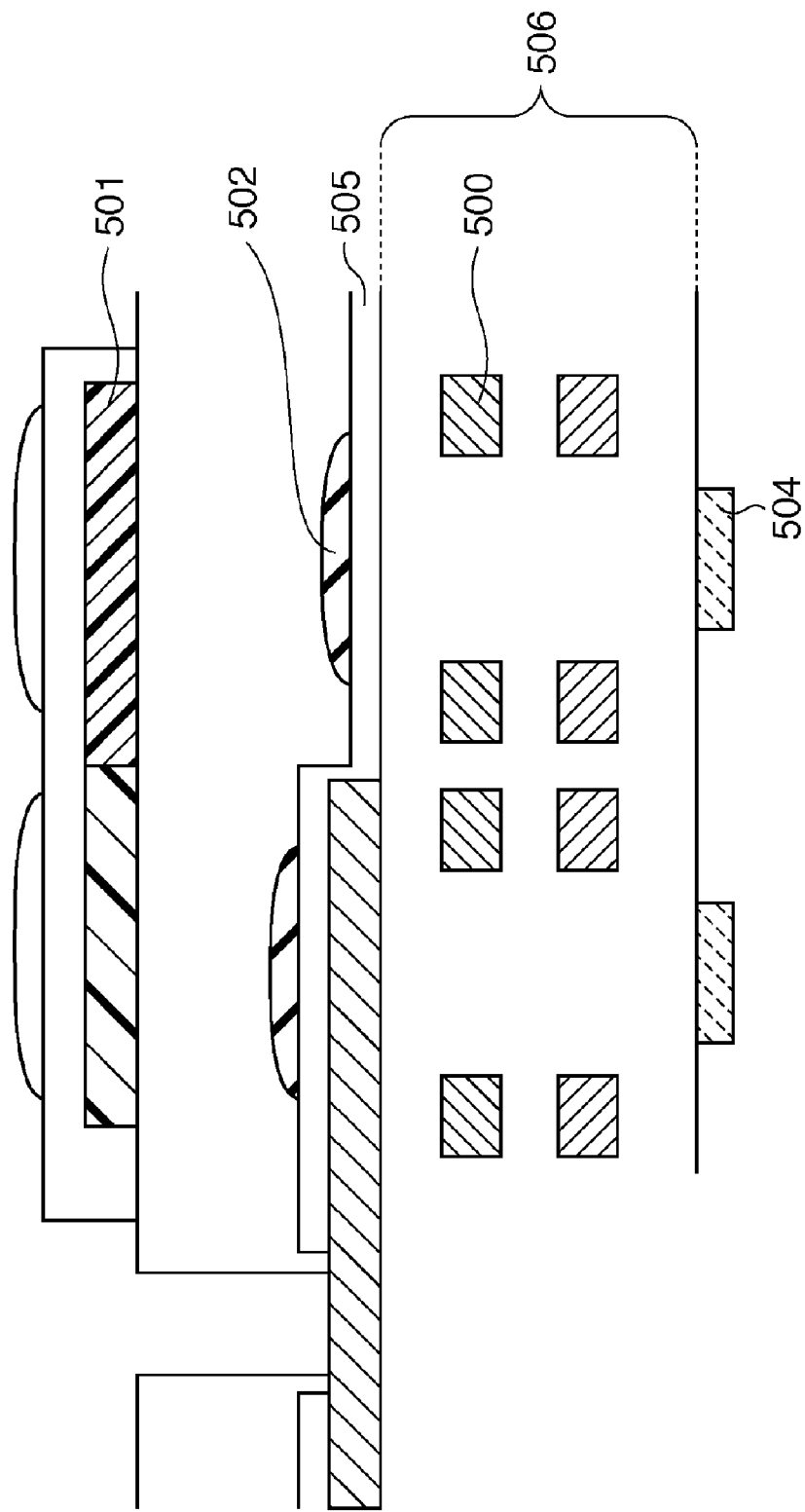
FIG. 13 is a schematic sectional view of a conventional MOS type photoelectric conversion device.

As shown in FIGS. 11 and 12, a method of manufacturing a photoelectric conversion device 200 according to the second embodiment is different from that according to the first embodiment in the following points. FIGS. 11 and 12 are sectional views showing the steps in the method of manufacturing a photoelectric conversion device 200 according to the second embodiment of the present invention.

The step shown in FIG. 11 is performed in place of that shown in 4H of FIG. 4. In the step shown in FIG. 11, an antireflection film 230 is formed so as to cover a wiring layer 106 and interlayer insulation film 105. The antireflection film 230 is made of, for example, silicon oxynitride.

A silicon nitride film is deposited by CVD so as to cover the antireflection film 230. The top face of the deposited silicon nitride film is planarized by CMP, thereby forming an interlayer insulation film 107 in an effective region ER and light-shielded region SR.

After the steps shown in 7C and 7D of FIG. 7, the step shown in FIG. 12 is performed before the step shown in FIG. 8. In the step shown in FIG. 12, an antireflection film 231 is formed so as to cover a passivation film 109 and the interlayer insulation film 107. The antireflection film 231 is made of, for example, silicon oxynitride.

As described above, according to this embodiment, a photoelectric conversion device is configured so as to prevent light reflection at the interfaces between the lower planarized layer 142 and the interlayer lens 110 and between the interlayer insulation films 107 and 105. This makes it possible to improve the light-collection efficiency to guide the incident light on a microlens 144 onto a photoelectric conversion unit 102E without reflecting it at these interfaces.

Although an antireflection film is effective in reducing an uneven color distribution and uneven luminance distribution in an image according to the signal output from the photoelectric conversion unit 102E, either the antireflection film 231 or 230 can be omitted as needed as long as a specification required for a product is satisfied. For example, if the antireflection film 230 is necessary and if the antireflection film 231 can be omitted, the step shown in FIG. 12 can be omitted after an interlayer insulation film 107 is formed.

The colored layer of the color filter layer may be arranged in a part or the whole of the light-shielded region SR. With this configuration, the light-shielding performance further improves. The colored layer may have an opening portion corresponding to the electrode pad, like the upper planarized layer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-036582, filed Feb. 18, 2008, which is hereby incorporated by reference herein in its entirety.

What is claimed is:

1. A photoelectric conversion device with an effective region, in which a photoelectric conversion unit is not shielded against light, and a light-shielded region, in which a photoelectric conversion unit is shielded against light, the photoelectric conversion device comprising:

a semiconductor substrate, in which the photoelectric conversion unit in the effective region and the photoelectric conversion unit in the light-shielded region are arranged;

a multilayer wiring structure arranged on the semiconductor substrate, the multilayer wiring structure including a first wiring layer, which serves as a top wiring layer in the effective region and which includes aluminum as a principal component, a first insulation film arranged in the effective region and the light-shielded region so as to cover the first wiring layer, and a second wiring layer, which serves as a top wiring layer arranged on the first insulation film in the light-shielded region and which includes aluminum as a principal component, wherein the first insulation film has, in the effective region, a first portion that is positioned above the photoelectric conversion unit and that functions as at least a part of an interlayer lens;

a color filter arranged above the interlayer lens; and a planarized layer arranged between the color filter and the interlayer lens, wherein the multilayer wiring structure further includes a first antireflection film arranged between the planarized layer and the interlayer lens, and wherein, letting λ be a wavelength of light transmitted through the color filter, and letting n2 and n3 be refractive indices of the first insulation film and the planarized layer, respectively, the first antireflection film is formed to have a thickness of $\lambda/4\sqrt{(n2 \times n3)}$ and a refractive index of $\sqrt{(n2 \times n3)}$.

2. The device according to claim 1, wherein
the first insulation film further includes, in the effective region, a second portion a top face of which is closer to a surface of the semiconductor substrate than a top face in the light-shielded region, and
the first portion has a convex shape along a direction away from the surface of the semiconductor substrate, thereby functioning as at least a part of the interlayer lens.

3. The device according to claim 2, wherein a top face of the first portion is closer to the surface of the semiconductor substrate than a top face in the light-shielded region.

4. The device according to claim 1, wherein
the multilayer wiring structure further includes a passivation film arranged in the effective region so as to cover at least the first portion, which is positioned above the photoelectric conversion unit in the effective region of the first insulation film, the passivation film being arranged in the light-shielded region so as to cover the second wiring layer,
the passivation film includes a third portion, which is positioned above the photoelectric conversion unit in the effective region, and
the first portion and the third portion function as the interlayer lens.

5. The device according to claim 4, wherein the third portion has a convex shape along a direction away from a surface of the semiconductor substrate, such that the first portion and the third portion function as the interlayer lens.

6. The device according to claim 1, wherein
the interlayer lens is formed of silicon nitride, and
the first antireflection film is formed of silicon oxynitride.

7. The device according to claim 1, wherein the multilayer wiring structure further includes:
a third wiring layer, which is arranged beneath the first wiring layer and includes aluminum as a principal component,
a second insulation film arranged in the effective region and the light-shielded region so as to cover the third wiring layer and insulate the first wiring layer and the third wiring layer from each other, and
a second antireflection film arranged between the first insulation film and the second insulation film.

8. The device according to claim 7, wherein
the first insulation film is formed of silicon nitride,
the second antireflection film is formed of silicon oxynitride, and
the second insulation film is formed of silicon oxide.

9. The device according to claim 1, wherein the second wiring layer shields the photoelectric conversion unit in the light-shielded region against light.

10. A device according to claim 1, wherein the device is incorporated in an image sensing system that includes:
an optical system, which forms an image on an image sensing plane of the photoelectric conversion device; and
a signal processing unit, which processes a signal output from the photoelectric conversion device and generates image data.

11. A photoelectric conversion device with an effective region, in which a photoelectric conversion unit is not shielded against light, and a light-shielded region, in which a photoelectric conversion unit is shielded against light, the photoelectric conversion device comprising:
a semiconductor substrate, in which the photoelectric conversion unit in the effective region and the photoelectric conversion unit in the light-shielded region are arranged;
a multilayer wiring structure arranged on the semiconductor substrate, the multilayer wiring structure including a first wiring layer, which serves as a top wiring layer in the effective region and which includes aluminum as a principal component, a first insulation film arranged in the effective region and the light-shielded region so as to cover the first wiring layer, and a second wiring layer, which serves as a top wiring layer arranged on the first insulation film in the light-shielded region and which includes aluminum as a principal component, wherein the first insulation film includes, in the effective region, a first portion that is positioned above the photoelectric conversion unit and that functions as at least a part of an interlayer lens;
a color filter arranged above the interlayer lens; and
a planarized layer arranged between the color filter and the interlayer lens,
wherein the multilayer wiring structure further includes a first antireflection film arranged between the planarized layer and the interlayer lens, a third wiring layer, which is arranged beneath the first wiring layer and which includes aluminum as a principal component, a second insulation film arranged in the effective region and the light-shielded region so as to cover the third wiring layer and insulate the first wiring layer and the third wiring layer from each other, and a second antireflection film arranged between the first insulation film and the second insulation film, and
wherein, letting $\lambda$ be a wavelength of light transmitted through the color filter, and letting n1 and n2 be refractive indices of the second insulation film and the first insulation film, respectively, the second antireflection film is formed to have a thickness of $\lambda/4\sqrt{(n1 \times n2)}$ and a refractive index of $\sqrt{(n1 \times n2)}$.

12. A photoelectric conversion device according to claim 11, wherein the photoelectric conversion device is incorporated in an image sensing system that includes:
an optical system, which forms an image on an image sensing plane of the photoelectric conversion device; and
a signal processing unit, which processes a signal output from the photoelectric conversion device and generates image data.

* * * * *